United States Patent
Finch et al.

(10) Patent No.: US 10,257,964 B2
(45) Date of Patent: Apr. 9, 2019

(54) REDUCING CONDENSATION RISK WITHIN LIQUID COOLED COMPUTERS

(71) Applicant: International Business Machines Corporation, Armonk, NY (US)

(72) Inventors: Richard B. Finch, New Paltz, NY (US); Jason T. Hirst, Poughkeepsie, NY (US); Gerald G. Stanquist, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 1037 days.

(21) Appl. No.: 14/444,013

(22) Filed: Jul. 28, 2014

(65) Prior Publication Data

US 2016/0025613 A1 Jan. 28, 2016

(51) Int. Cl.
| | | |
|---|---|---|
| H05K 7/20 | (2006.01) | |
| F25B 47/00 | (2006.01) | |
| G06F 1/20 | (2006.01) | |

(52) U.S. Cl.
CPC ....... H05K 7/20763 (2013.01); F25B 47/006 (2013.01); G06F 1/20 (2013.01); G06F 2200/201 (2013.01)

(58) Field of Classification Search
CPC .................................. H05K 7/20763
USPC ........................................ 702/123
See application file for complete search history.

(56) References Cited

U.S. PATENT DOCUMENTS

| | | | | |
|---|---|---|---|---|
| 4,512,161 A * | 4/1985 | Logan | ................ | G05D 23/1393 236/44 R |
| 7,135,877 B2 * | 11/2006 | Beaman | ............. | G01R 31/2874 324/750.09 |
| 8,157,626 B2 | 4/2012 | Day | | |
| 8,553,416 B1 | 10/2013 | Carlson et al. | | |
| 2010/0263855 A1 * | 10/2010 | Arimilli | ............. | G05D 23/1931 165/288 |
| 2011/0290448 A1 * | 12/2011 | Campbell | ............. | F28D 1/0471 165/104.13 |
| 2012/0065795 A1 * | 3/2012 | Blackshaw | ............ | F24F 11/006 700/295 |
| 2013/0098597 A1 * | 4/2013 | Fujimoto | ........... | H05K 7/20745 165/287 |
| 2015/0317589 A1 * | 11/2015 | Anderson | .............. | G06Q 10/08 705/7.25 |

(Continued)

FOREIGN PATENT DOCUMENTS

JP 2001012784 A 1/2001

OTHER PUBLICATIONS

Finch et al., "Reducing Condensation Risk Within Liquid Cooled Computers," U.S. Appl. No. 14/870,558, filed Sep. 30, 2015, 32 pages.

(Continued)

*Primary Examiner* — Ricky Ngon

(74) *Attorney, Agent, or Firm* — VanLeeuwen & VanLeeuwen; Tihon Poltavets

(57) ABSTRACT

An approach is provided in which a manufacturing test scheduling system predicts a dew point forecast indoor a facility based upon outdoor weather data and indoor environment data. The manufacturing test scheduling system selects time slots in the dew point forecast based upon a pre-defined dew point threshold and, in turn, schedules tests of a liquid cooled computer system during the selected time slots.

9 Claims, 8 Drawing Sheets

(56) References Cited

U.S. PATENT DOCUMENTS

2016/0161998 A1  6/2016  Kinstle, III

OTHER PUBLICATIONS

"List of IBM Patents or Patent Applications Treated as Related," Letter from Leslie A. Van Leeuwen, Sep. 30, 2015, 1 page.

* cited by examiner

REDUCING CONDENSATION RISK WITHIN LIQUID COOLED COMPUTERS

BACKGROUND

The present disclosure relates to reducing the risk of internal condensation forming within a liquid cooled computer system during manufacturing test.

Computer systems typically include cooling mechanisms to cool components that generate heat, such as processors, co-processors, etc. These cooling mechanisms include heat sinks coupled to a component to dissipate the heat, conventional fans to blow air over the component, or a combination of a heat sink and a conventional fan to dissipate heat. High-end computer systems, however, have components that generate a substantial amount of heat, which conventional cooling methods are not able to dissipate. As such, high-end computer systems utilize a liquid cooled system that includes "plumbing" coupled to critical components to dissipate the heat, similar to an automobile radiator cooling system.

Liquid cooled systems often carry cold water set at a "system setpoint" temperature to cool the internal components. During normal operation, the system setpoint temperature is set within a temperature range at a level that adequately cools the internal components, which is typically lower than that of the surrounding air. Trade-offs of determining the system setpoint temperature involve determining whether the energy expended to cool the liquid produces a corresponding benefit in having a lower operating temperature of the logic of the computer system.

Another consideration when setting the system setpoint temperature is to maintain the system setpoint temperature at or above the dew point of the surrounding air in order to avoid condensation build-up inside the computer system. As those skilled in the art can appreciate, the dew point is a temperature at which water vapor in air at constant barometric pressure condenses into liquid water at the same rate at which it evaporates. The dew point is associated with relative humidity such that a high relative humidity indicates that the dew point is closer to the current air temperature. For example, a relative humidity of 100% indicates that the dew point is equal to the current air temperature and that the air is maximally saturated with water. As such, condensation forms on the computer system's liquid cooled plumbing if the system setpoint temperature is set below the dew point of the surrounding air.

When high-end computer systems undergo environmental testing at a test facility, the test facility performs temperature bias thermal stress tests to test the cooling system. The temperature bias thermal stress test involves a "hot" bias test where the system setpoint is set above a maximum system setpoint temperature, and a "cold" bias test where the system setpoint is set at or below a minimum system setpoint temperature. For example, assuming the specified system setpoint temperature range is 12 degree Celsius to 22 degree Celsius, the cold bias test may execute at 10 degree Celsius and the hot bias test may execute at 24 degree Celsius to ensure an operating margin of the liquid cooled system.

The "cold" bias test is problematic, however, if the desired cold bias system setpoint temperature is set below the dew point of the surrounding test facility environment. As discussed above, condensation forms on the plumbing if the system setpoint temperature is below the surrounding environment's dew point. Once condensation has formed on the plumbing inside the computer system during manufacturing test, the condensation often leads to system failure because of wet circuitry or by the deposition of residues left behind after the condensation has evaporated.

BRIEF SUMMARY

According to one embodiment of the present disclosure, an approach is provided in which a manufacturing test scheduling system predicts a dew point forecast indoor a facility based upon outdoor weather data and indoor environment data. The manufacturing test scheduling system selects time slots in the dew point forecast based upon a pre-defined dew point threshold and, in turn, schedules tests of a liquid cooled computer system during the selected time slots.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

Figure 1:
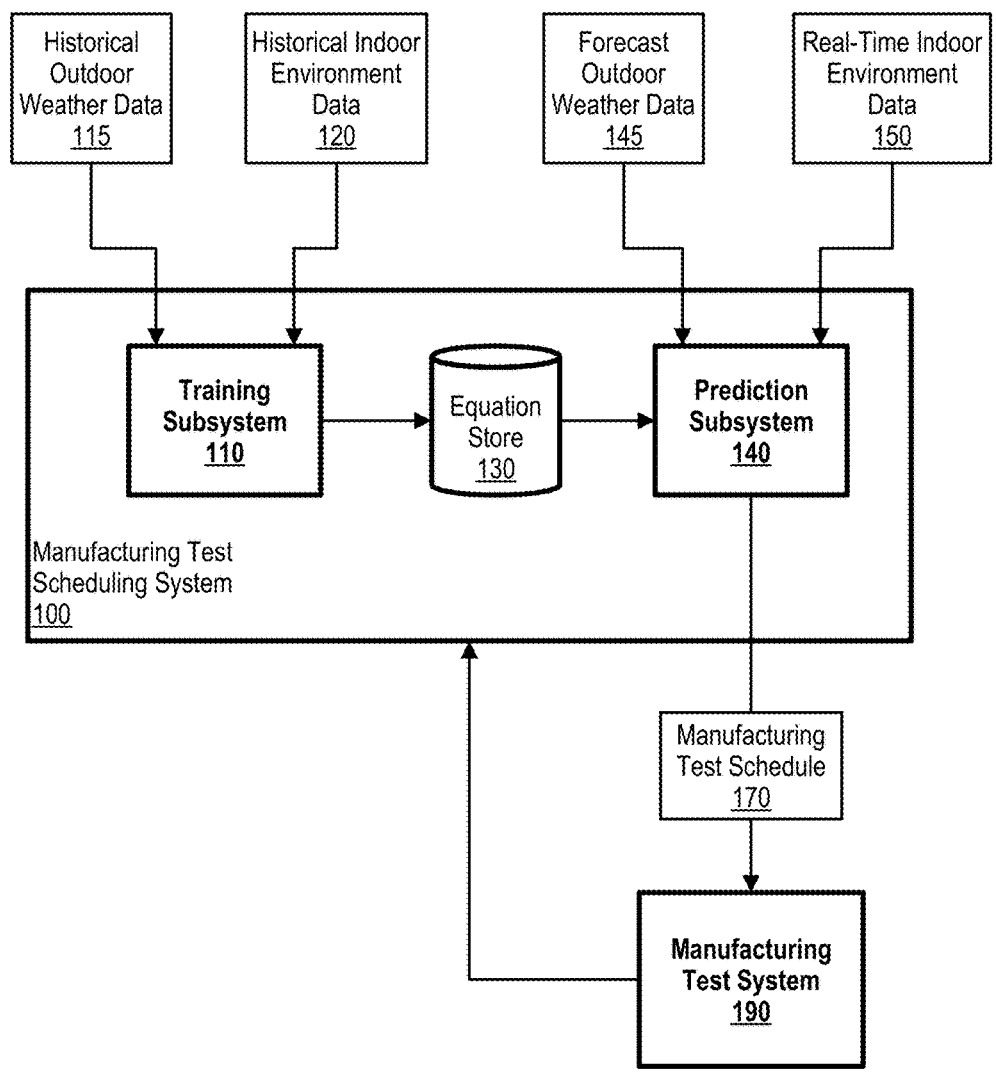
FIG. 1 is a diagram depicting an example of a manufacturing test scheduling system that generates a test schedule to ensure that a liquid cooled computer system avoids internal condensation during environmental tests.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The following detailed description will generally follow the summary of the disclosure, as set forth above, further explaining and expanding the definitions of the various aspects and embodiments of the disclosure as necessary.

FIG. 1 is a diagram depicting an example of a manufacturing test scheduling system that generates a test schedule to ensure that a liquid cooled computer system avoids internal condensation during environmental tests. Manufacturing test scheduling system 100, in one embodiment, includes training subsystem 110 and prediction subsystem 140. Training subsystem 110 uses historical outdoor weather data 115 and historical indoor environment data 120 to create a prediction equation for forecasting dew point levels within a facility. Prediction subsystem 140 uses the prediction equation, along with forecast outdoor weather data 145 and real-time indoor environment data 150 to forecast dew points within the facility and generate a manufacturing test schedule accordingly (discussed in more detail below).

Training subsystem 110 begins the process of creating a prediction equation, in one embodiment, by converting time series data of historical outdoor weather data 110 and historical indoor environment data 120 to an auto-regression (AR) model. In one embodiment, the AR model takes the form of:

$$Y[t]=a[0]+a[1]*Y[t-1]+a[2]*Y[t-2]+ \ldots +a[p]*Y[t-p]+e[t];$$

where a[n] are coefficients, Y[m] are values being measured from the time series, and e[t] is white noise if the time series is stationary (e.g., not a long term trend). In this embodiment, training subsystem 110 may generate multiple AR models based upon the data included in historical outdoor weather data 115 and historical indoor environment data 120 (temperature, humidity, dew point, etc., see FIG. 4 and corresponding text for further details).

Next, training subsystem 110 builds a system of equations using the AR models and solves the system of equations for regression coefficients. In turn, training subsystem 110 generates a prediction equation using regression coefficients and stores the prediction equation in equation store 130 (see FIG. 4 and corresponding text for further details). In one embodiment, the prediction equation includes coefficients corresponding to both outdoor weather data and indoor environment data. For example, the prediction equation may be of the form:

$$Y\{Int.DP\}[t]=0.45+0.23*Y\{ext.hum\}[t-1]+0.7*Y\{int.DP\}[t-1]-0.03*Y\{ext.temp\}[t-1]$$

As can be seen from the above prediction equation example, the indoor dew point at time t equals a constant 0.45+0.23*(outdoor humidity at t−1)+0.7*(indoor dew point at t−1)+0.03*(outdoor temperature at t−1).

Prediction subsystem 140 retrieves the prediction equation from equation store 130 and identifies values required in the predication equation corresponding to forecast outdoor weather data 145 and real-time indoor environment data 150. As such, prediction subsystem 140 converts forecast outdoor weather data 145 and real-time indoor environment data 150 into different time series and inserts the time series values into the corresponding prediction equation variable locations to generate a indoor dew point forecast. From the dew point forecast, prediction subsystem 140 identifies forecasted increased dew point time slots above a pre-defined dew point threshold and reduced dew point time slots below the pre-defined dew point threshold. In one embodiment, the pre-defined dew point threshold corresponds to the liquid cooled computer system's cold bias test temperature. For example, if the cold bias test temperature is 10 degrees Celsius and a test engineer requires a one degree margin, the pre-defined threshold will be 11 degree Celsius (see FIG. 2 and corresponding text for further details).

Figure 3:
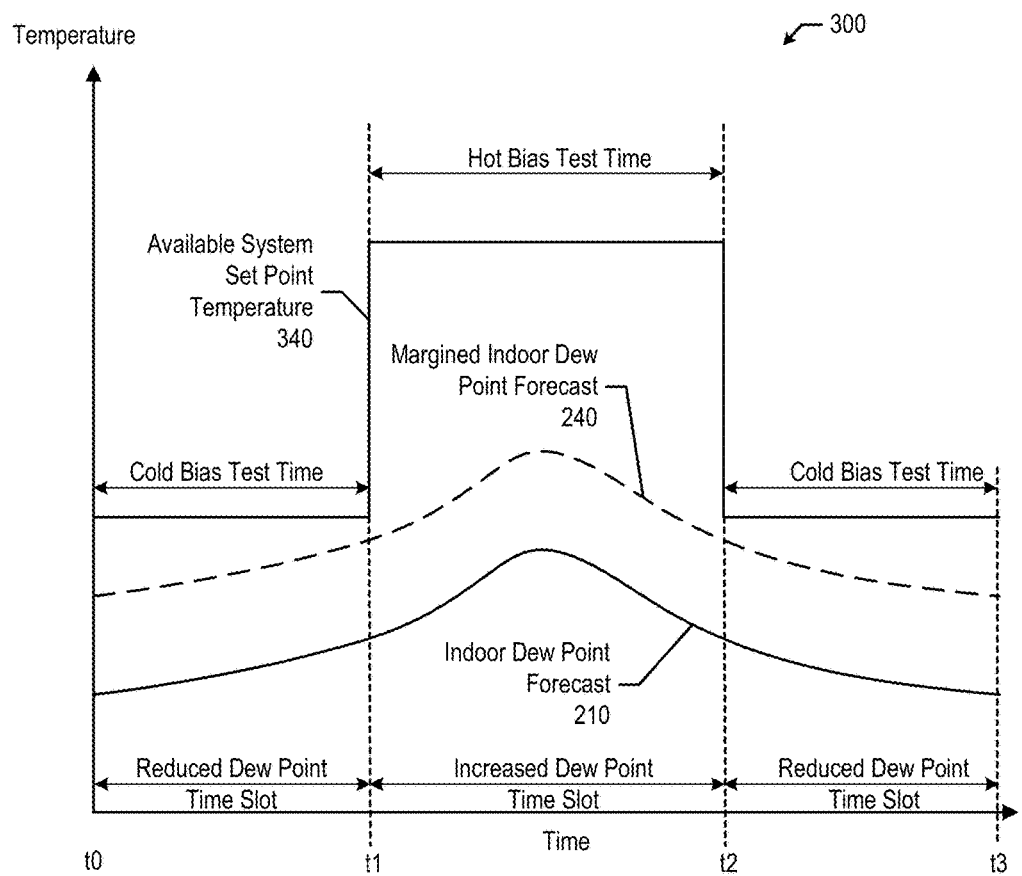
FIG. 3 is a diagram depicting a graphical example showing forecasted available cold bias testing time slots and hot bias testing time slots based upon a indoor dew point forecast.

Prediction subsystem 140, in turn, generates manufacturing test schedule 170 that schedules cold bias tests during the forecasted reduced dew pont time slots and schedules hot bias tests during the forecasted increased dew point time slots (see FIG. 3 and corresponding text for further details). In one embodiment, prediction subsystem 140 may modify an initial test plan that has cold bias tests and high bias tests scheduled during random times. For example, an initial test plan may include three cold bias tests and four hot bias tests that are schedule throughout a working shift. In this example, prediction subsystem 140 re-schedules the cold bias tests to occur during the forecasted reduced dew point time slots and schedules the hot bias tests to occur during the forecasted increased dew point time slots In turn, manufacturing test system 190 performs environmental tests on the liquid cooled computer system based upon manufacturing test schedule 170. In one embodiment, manufacturing test system 190 provides feedback to manufacturing test scheduling system 100 pertaining to the accuracy of the indoor dew point forecast. For example, manufacturing test system 190 may compare the forecasted dew point with the actual indoor dew point and determine that the forecast is off by one degree. In this example, manufacturing test system 190 provides the feedback to manufacturing test scheduling system 100 so manufacturing test scheduling system 100 may adjust the prediction equation accordingly.

Figure 2:
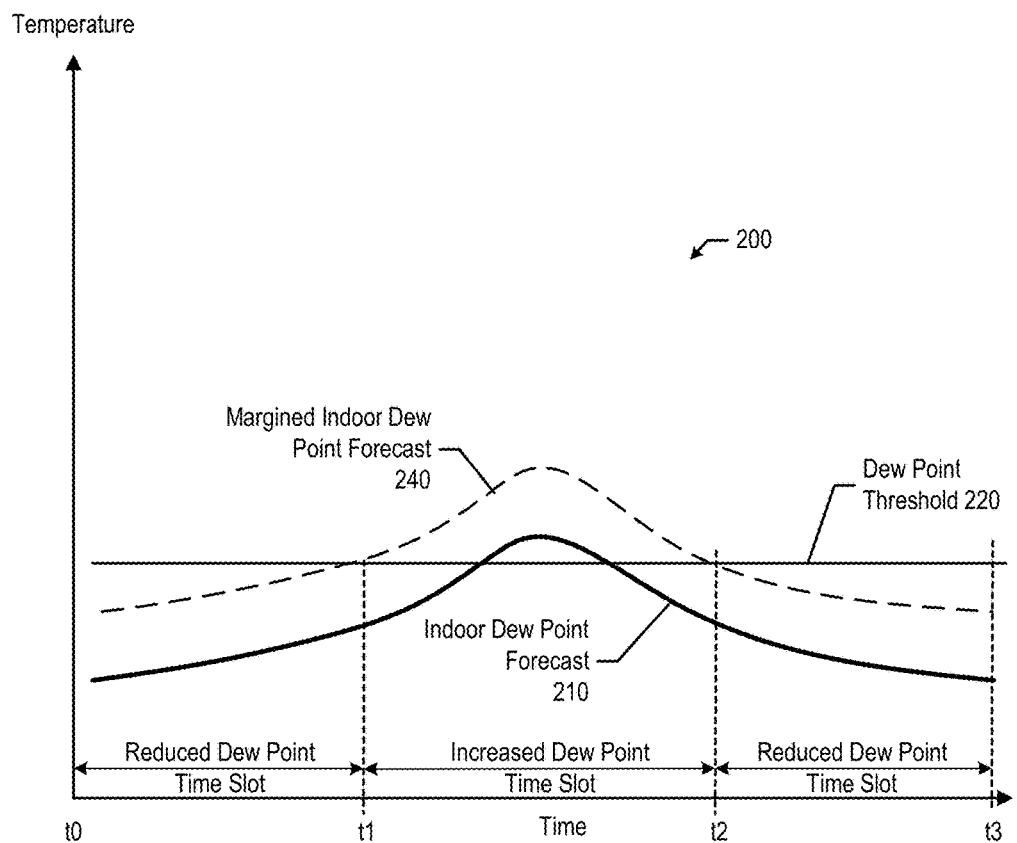
FIG. 2 is a diagram depicting a graphical example of a indoor dew point forecast.

FIG. 2 is a diagram depicting a graphical example of a indoor dew point forecast plotted over time. As discussed in more detail below, the manufacturing test scheduling system inserts forecast outdoor weather data and real-time indoor environment data into a prediction equation to forecast dew points in a manufacturing facility (indoor dew point forecast 210). Assuming that graph 200 depicts a 12-hour shift, indoor dew point forecast 210 is low at the beginning of the shift and steadily increases until mid-shift, at which point indoor dew point forecast 210 reaches a high and begins decreasing to the end of the shift. A test engineer adds a margin (e.g., 1-2 degrees) to indoor dew point forecast 210, which results in margined indoor dew point forecast 240.

Graph 200 depicts dew point threshold 220, which is a pre-determined threshold set by the test engineer based on the system setpoint temperature of the cold bias test. For example, if the cold bias test is at 10 degree Celsius, the test engineer may set dew point test threshold 220 at 10 degree Celsius. As can be seen, margined indoor dew point forecast 240 is lower than dew point threshold 220 between times t0 and t1, higher between times t1 and t2, and lower between times t2 and t3. As such, the manufacturing test scheduling system schedules cold bias testing between times t0-t1 and t2-t3, and schedules hot bias testing between times t1 and t2 (see FIG. 3 and corresponding text for further details).

FIG. 3 is a diagram depicting a graphical example showing forecasted available cold bias testing time slots and hot bias testing time slots based upon a indoor dew point forecast. As discussed in FIG. 2, margined indoor dew point forecast 240 is below dew point threshold 220 between times t0-t1 and t2-t3. As such, graph 300 shows available system setpoint temperature 340, which indicates that cold bias testing should be scheduled between times t0-t1 and times t2-t3, which are reduced dew point time slots. Likewise, since margined indoor dew point forecast 240 is above dew point test threshold 220 between times t1-t2, hot bias testing should be scheduled between times t1-t2, which is an increased dew point time slot. As those skilled in the art can appreciate, the manufacturing system does not have to perform cold bias testing or hot bias testing during the entire time slots as shown in FIG. 3, but rather the cold bias tests may be performed at some points between times t0-t1 and t2-t3, and should not be performed between times t1-t2 to avoid condensation forming on the liquid cooled computer system's plumbing.

Figure 4:
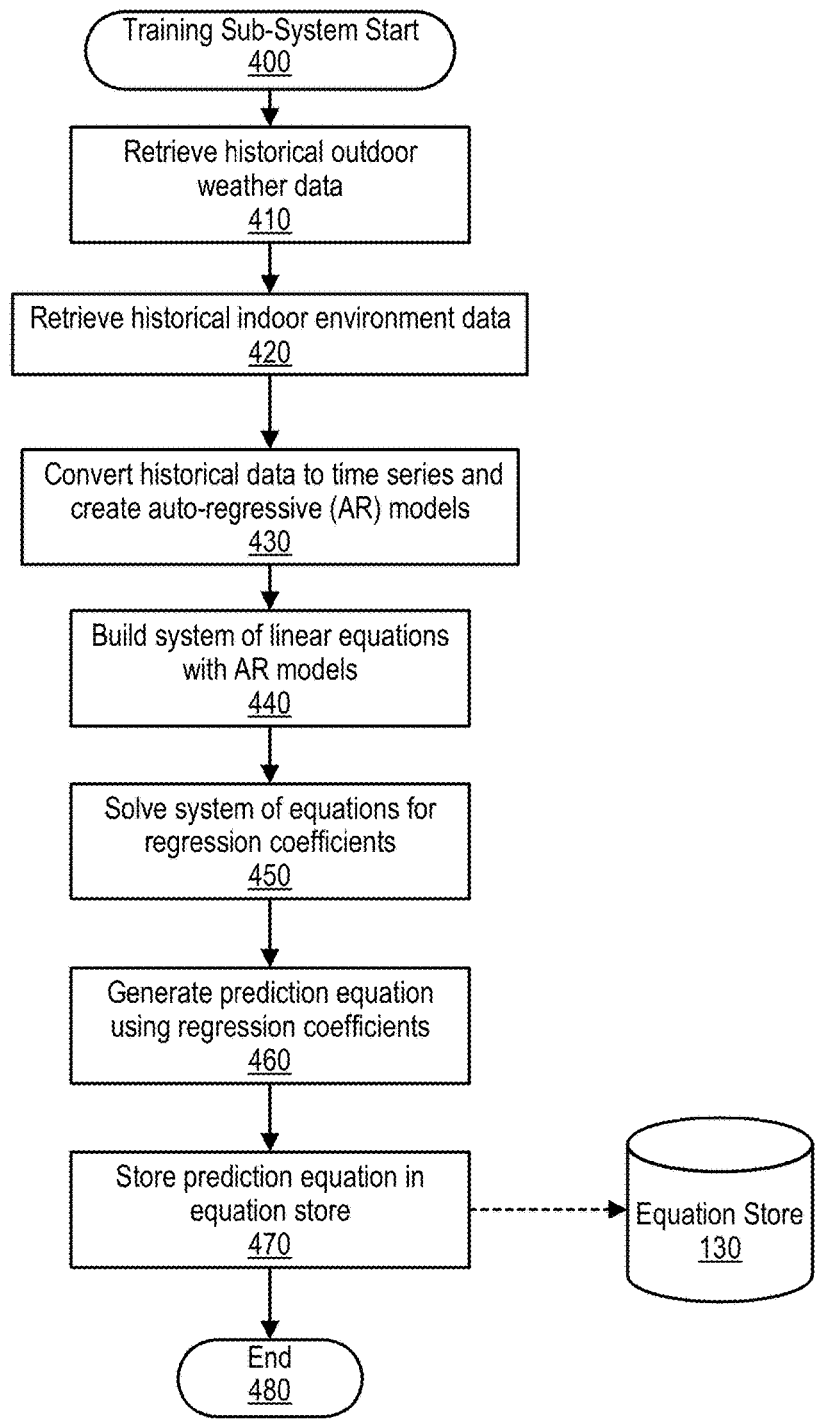
FIG. 4 is an exemplary flowchart depicting steps taken by a manufacturing test scheduling system to create a dew point prediction equation based upon historical outdoor weather data and historical environmental data.

FIG. 4 is an exemplary flowchart depicting steps taken by a manufacturing test scheduling system to create a dew point prediction equation based upon historical outdoor weather data and historical indoor environment data. The dew point prediction equation quantifies a historical relationship between outside weather conditions and indoor environment conditions within a manufacturing test facility.

Manufacturing test scheduling system processing commences at 400, whereupon, the process retrieves historical outdoor weather data (step 410) and historical indoor environment data (step 420). In one embodiment, the historical outdoor weather data and historical indoor environment data are feeds in a JSON (JavaScript Object Notation) format. In another embodiment, the historical outdoor weather data and historical indoor environment data are data files stored in a storage area.

At step 430, the process converts the historical indoor environment data and the historical outdoor weather data to time series, and creates auto-regressive (AR) models from the time series data. Time series are representations of a sequence of data points measured at successive points in time spaced at uniform time intervals. The AR models, in turn, may be of the form:

$$Y[t]=a[0]+a[1]*Y[t-1]+a[2]*Y[t-2]+\ldots+a[p]*Y[t-p]+e[t];$$

where a[n] are coefficients, Y[m] are values being measured from the time series, and e[t] is white noise if the time series is stationary (e.g., not a long term trend).

At step 440, the process builds a system of equations from the AR models and solves the system of equations using, for example, a least squares approach at step 450. At step 460, the process generates a dew point prediction equation using the regression coefficients, which may include variables corresponding to outdoor weather data and indoor environment data (see FIG. 1 and corresponding text for further details). In turn, the process stores the dew point prediction equation in equation store 130 at step 470, and processing ends at 480.

Figure 5:
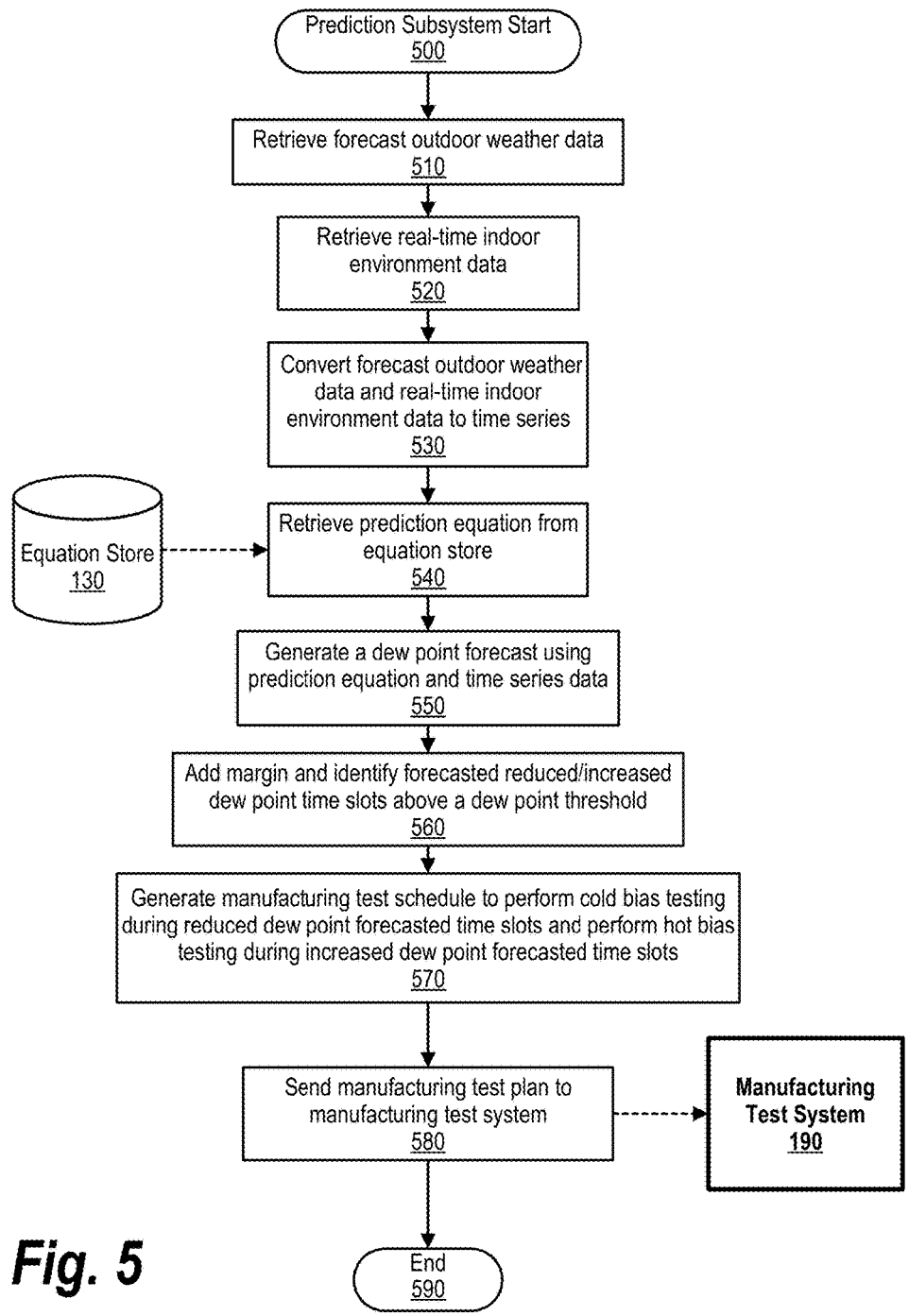
FIG. 5 is an exemplary flowchart depicting steps taken by a manufacturing test scheduling system to create a indoor dew point forecast and a manufacturing test schedule based upon the indoor dew point forecast.

FIG. 5 is an exemplary flowchart depicting steps taken by a manufacturing test scheduling system to create a indoor dew point forecast and a manufacturing test schedule based upon the indoor dew point forecast. Manufacturing test scheduling system processing commences at 500, whereupon the process retrieves forecast outdoor weather data (step 510) and real-time indoor environment data (step 520). In one embodiment, the forecast outdoor weather data and the real-time indoor environment data may be a JSON feed as discussed above.

At step 530, the process converts the forecast outdoor weather data and real-time indoor environment data to time series. The process, at step 540, retrieves the prediction equation from equation store 130, which was generated from the steps shown in FIG. 4 and, at step 550, the process inserts the forecast weather time series data and real-time indoor environment time series data into the prediction equation at corresponding spots to generate a indoor dew point forecast (e.g., indoor dew point forecast 210 shown in FIG. 2). For example, assuming the dew point prediction equation is:

$$Y\{Ind.DP\}[t]=0.45+0.23*Y\{ext.hum.\}[t-1]+0.7*Y\{ind.DP\}[t-1]-0.03*Y\{ind.Temp\}[t-1]$$

the process uses lagged (t−1) outdoor humidity values, indoor dew point calculations, and indoor temperature values to forecast an indoor dew point value at time t.

At step 560, the process adds a margin to the indoor dew point forecast and identifies forecasted increased dew point time slots and reduced dew point time slots based upon a pre-determined dew point threshold corresponding to cold bias testing of the liquid cooled computer system (see FIG. 2 and corresponding text for further details). At step 570, the process generates manufacturing test schedule 170 that schedules cold bias tests during the reduced dew point time slots and schedules hot bias tests during the increased dew point time slots. In one embodiment, prediction subsystem 140 may modify an initial test plan by re-arranging cold bias tests and high bias tests as discussed above.

Figure 6:
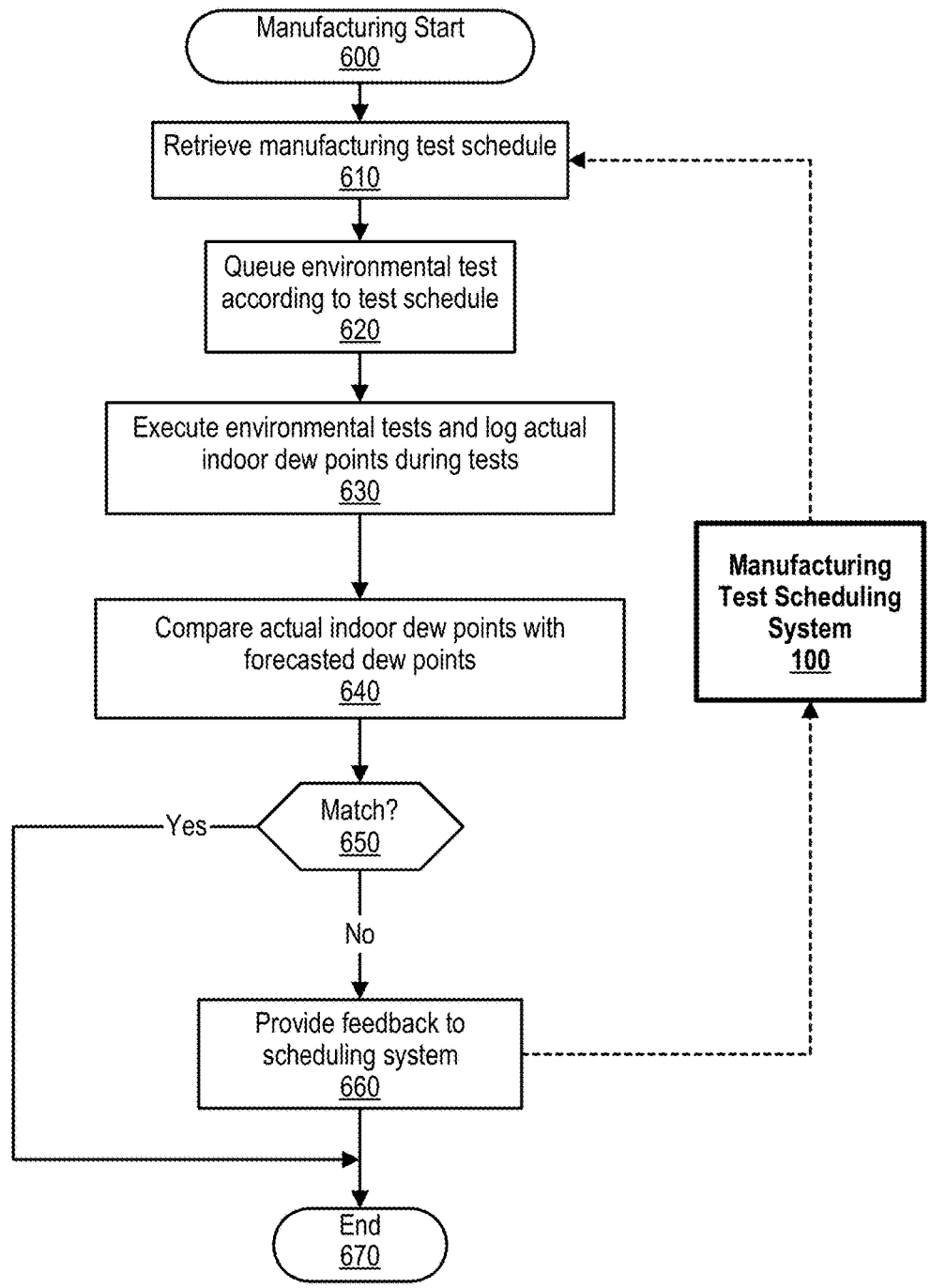
FIG. 6 is an exemplary flowchart depicting steps taken by a manufacturing test system to execute environmental tests according to a manufacturing test schedule.

At step 580, the process sends the manufacturing test plan to manufacturing test system 190 to test the liquid cooled computer systems (see FIG. 6 and corresponding text for further details). Processing ends at 590.

FIG. 6 is an exemplary flowchart depicting steps taken by a manufacturing test system to execute environmental tests according to a manufacturing test schedule. Manufacturing test processing commences at 600, whereupon the process receives a manufacturing test schedule from manufacturing test scheduling system 100 at step 610. At step 620, the process queues environment tests according to the test schedule.

Next, at step 630, the process executes the scheduled environmental tests and, in one embodiment, logs actual indoor dew point information during the tests, such as actual indoor dew point measurements, indoor humidity measurements, or indoor temperature measurements. At step 640, the process compares the actual dew point information with the forecasted dew point information, and determines whether the forecasted dew point information matches the actual dew point information (or within a threshold, decision 650). If the actual dew point information does not match the forecasted dew point information, decision 650 branches to the "No" branch, whereupon the manufacturing test system provides feedback to manufacturing test scheduling system 100 for manufacturing test scheduling system 100 to modify its prediction equation (step 660). On the other hand, if the actual dew point information matches the forecasted dew point information, decision 650 branches to the "No" branch, bypassing step 660. Processing ends at 670.

Figure 7:
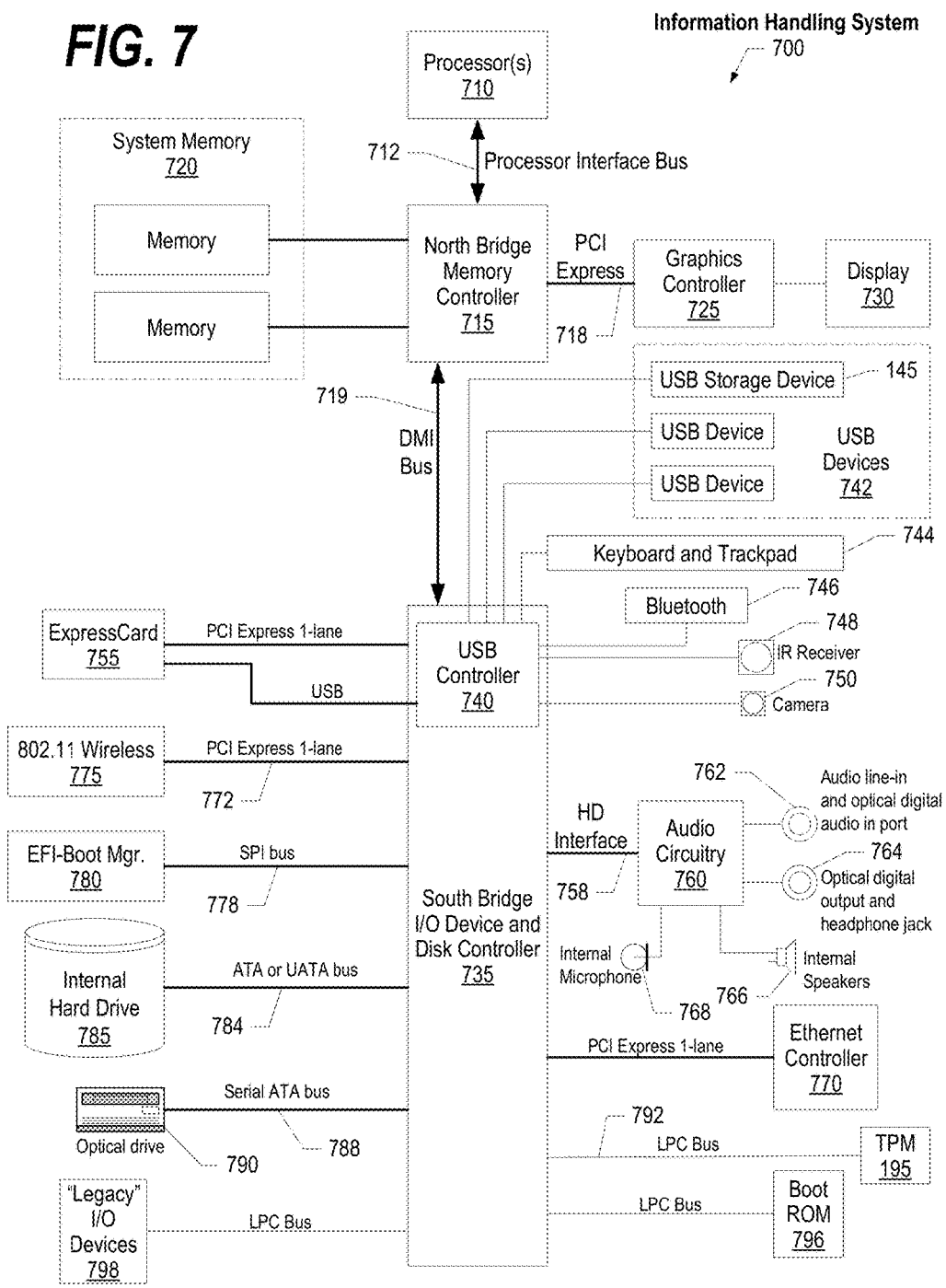
FIG. 7 is a block diagram of a data processing system in which the methods described herein can be implemented.

FIG. 7 illustrates information handling system 700, which is a simplified example of a computer system capable of performing the computing operations described herein.

Information handling system 700 includes one or more processors 710 coupled to processor interface bus 712. Processor interface bus 712 connects processors 710 to Northbridge 715, which is also known as the Memory Controller Hub (MCH). Northbridge 715 connects to system memory 720 and provides a means for processor(s) 710 to access the system memory. Graphics controller 725 also connects to Northbridge 715. In one embodiment, PCI Express bus 718 connects Northbridge 715 to graphics controller 725. Graphics controller 725 connects to display device 730, such as a computer monitor.

Northbridge 715 and Southbridge 735 connect to each other using bus 719. In one embodiment, the bus is a Direct Media Interface (DMI) bus that transfers data at high speeds in each direction between Northbridge 715 and Southbridge 735. In another embodiment, a Peripheral Component Interconnect (PCI) bus connects the Northbridge and the Southbridge. Southbridge 735, also known as the I/O Controller Hub (ICH) is a chip that generally implements capabilities that operate at slower speeds than the capabilities provided by the Northbridge. Southbridge 735 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 796 and "legacy" I/O devices (using a "super I/O" chip). The "legacy" I/O devices (798) can include, for example, serial and parallel ports, keyboard, mouse, and/or a floppy disk controller. The LPC bus also connects Southbridge 735 to Trusted Platform Module (TPM) 795. Other components often included in Southbridge 735 include a Direct Memory Access (DMA) controller, a Programmable Interrupt Controller (PIC), and a storage device controller, which connects Southbridge 735 to nonvolatile storage device 785, such as a hard disk drive, using bus 784.

ExpressCard 755 is a slot that connects hot-pluggable devices to the information handling system. ExpressCard 755 supports both PCI Express and USB connectivity as it connects to Southbridge 735 using both the Universal Serial Bus (USB) the PCI Express bus. Southbridge 735 includes USB Controller 740 that provides USB connectivity to devices that connect to the USB. These devices include webcam (camera) 750, infrared (IR) receiver 748, keyboard and trackpad 744, and Bluetooth device 746, which provides for wireless personal area networks (PANs). USB Controller 740 also provides USB connectivity to other miscellaneous USB connected devices 742, such as a mouse, removable nonvolatile storage device 745, modems, network cards, ISDN connectors, fax, printers, USB hubs, and many other types of USB connected devices. While removable nonvolatile storage device 745 is shown as a USB-connected device, removable nonvolatile storage device 745 could be connected using a different interface, such as a Firewire interface, etcetera.

Wireless Local Area Network (LAN) device 775 connects to Southbridge 735 via the PCI or PCI Express bus 772. LAN device 775 typically implements one of the IEEE 802.11 standards of over-the-air modulation techniques that all use the same protocol to wireless communicate between information handling system 700 and another computer system or device. Optical storage device 790 connects to Southbridge 735 using Serial ATA (SATA) bus 788. Serial ATA adapters and devices communicate over a high-speed serial link. The Serial ATA bus also connects Southbridge 735 to other forms of storage devices, such as hard disk drives. Audio circuitry 760, such as a sound card, connects to Southbridge 735 via bus 758. Audio circuitry 760 also provides functionality such as audio line-in and optical digital audio in port 762, optical digital output and headphone jack 764, internal speakers 766, and internal microphone 768. Ethernet controller 770 connects to Southbridge 735 using a bus, such as the PCI or PCI Express bus. Ethernet controller 770 connects information handling system 700 to a computer network, such as a Local Area Network (LAN), the Internet, and other public and private computer networks.

While FIG. 7 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 795) shown in FIG. 7 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 8.

Figure 8:
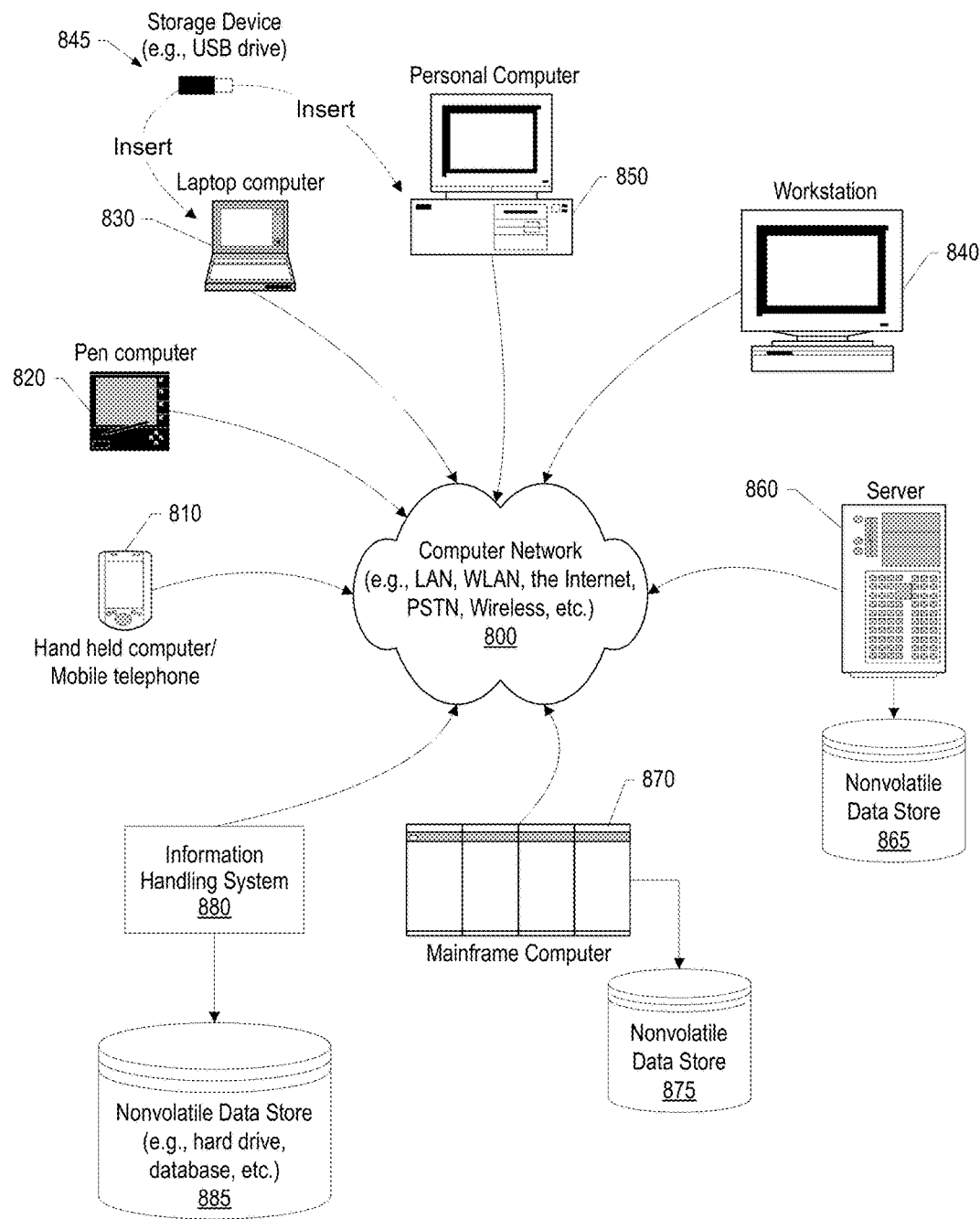
FIG. 8 provides an extension of the information handling system environment shown in FIG. 7 to illustrate that the methods described herein can be performed on a wide variety of information handling systems which operate in a networked environment.

FIG. 8 provides an extension of the information handling system environment shown in FIG. 7 to illustrate that the methods described herein can be performed on a wide variety of information handling systems that operate in a networked environment. Types of information handling systems range from small handheld devices, such as handheld computer/mobile telephone 810 to large mainframe systems, such as mainframe computer 870. Examples of handheld computer 810 include personal digital assistants (PDAs), personal entertainment devices, such as MP3 players, portable televisions, and compact disc players. Other examples of information handling systems include pen, or tablet, computer 820, laptop, or notebook, computer 830, workstation 840, personal computer system 850, and server 860. Other types of information handling systems that are not individually shown in FIG. 8 are represented by information handling system 880. As shown, the various information handling systems can be networked together using computer network 800. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 8 depicts separate nonvolatile data stores (server 860 utilizes nonvolatile data store 865, mainframe computer 870 utilizes nonvolatile data store 875, and information handling system 880 utilizes nonvolatile data store 885). The nonvolatile data store can be a component that is external to the various information handling systems or can be internal to one of the information handling systems. In addition, removable nonvolatile storage device 745 can be shared among two or more information handling systems using various techniques, such as connecting the removable nonvolatile storage device 745 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A computer program product stored in a computer readable storage medium, comprising computer program code that, when executed by an information handling system, causes the information handling system to perform actions comprising:
   generating an indoor dew point forecast based upon outdoor weather data and indoor environment data, wherein the indoor dew point forecast corresponds to an area indoor a facility;
   selecting one or more time slots in the dew point forecast corresponding to one or more sets of a plurality of predicted dew points in the indoor dew point forecast that are each below a pre-defined dew point threshold; and
   performing one or more cold bias tests on a liquid cooled computer system during the selected one or more time slots to inhibit condensation from forming in the liquid cooled computer system while the liquid cooled computer system is tested at a temperature below a minimum system setpoint temperature of the liquid cooled computer system.

2. The computer program product of claim 1 wherein the information handling system performs further actions comprising:
   generating a plurality of auto-regressive models based upon historical outdoor weather data of the outdoor weather data and historical indoor environment data of the indoor environment data;
   building a system of equations using the plurality of auto-regressive models;
   solving the system of equations, resulting in a plurality of regression coefficients; and
   generating a prediction equation based upon the plurality of regression coefficients.

3. The computer program product of claim 2 wherein the information handling system performs further actions comprising:
   receiving a forecast of the outdoor weather data;
   receiving real-time indoor environment data corresponding to real-time environmental conditions at the indoor area; and
   combining the forecast outdoor weather data and the real-time indoor environment data with the prediction equation based upon one or more of the plurality of regression coefficients during the generation of the indoor dew point forecast.

4. The computer program product of claim 2 wherein the information handling system performs further actions comprising:
   performing the one or more cold bias tests on the liquid cooled computer system during the one or more time slots;
   collecting actual indoor dew point data during the one or more cold bias tests; and
   adjusting the prediction equation based upon analyzing the actual indoor dew point data.

5. The computer program product of claim 1 wherein the information handling system performs further actions comprising:
   retrieving an initial manufacturing test schedule that includes the one or more cold bias tests scheduled according to a first test order; and
   generating a second test order that schedules the one or more cold bias tests to execute during the one or more time slots.

6. An information handling system comprising:
   one or more processors;
   a memory coupled to at least one of the processors; and
   a set of computer program instructions stored in the memory and executed by at least one of the processors in order to perform actions of:
     generating an indoor dew point forecast based upon outdoor weather data and indoor environment data, wherein the indoor dew point forecast corresponds to an area indoor a facility;
     selecting one or more time slots in the dew point forecast corresponding to one or more sets of a plurality of predicted dew points in the indoor dew point forecast that are each below a pre-defined dew point threshold; and
     performing one or more cold bias tests on a liquid cooled computer system during the selected one or more time slots to inhibit condensation from forming in the liquid cooled computer system while the liquid cooled computer system is tested at a temperature below a minimum system setpoint temperature of the liquid cooled computer system.

7. The information handling system of claim 6 wherein the processors perform additional actions comprising:
   generating a plurality of auto-regressive models based upon historical outdoor weather data of the outdoor weather data and historical indoor environment data of the indoor environment data;
   building a system of equations using the plurality of auto-regressive models;
   solving the system of equations, resulting in a plurality of regression coefficients;
   generating a prediction equation based upon the plurality of regression coefficients;
   receiving a forecast of the outdoor weather data and real-time indoor environment data corresponding to real-time environmental conditions at the indoor area; and combining the forecast outdoor weather data and the real-time indoor environment data with the prediction equation based upon one or more of the plurality of regression coefficients during the generation of the indoor dew point forecast.

8. The information handling system of claim 7 wherein the processors perform additional actions comprising:

performing the one or more cold bias tests on the liquid cooled computer system during the one or more time slots;

collecting actual indoor dew point data during the one or more cold bias tests; and adjusting the prediction equation based upon analyzing the actual indoor dew point data.

9. The information handling system of claim 7 wherein the processors perform additional actions comprising:

retrieving an initial manufacturing test schedule that includes the one or more cold bias tests scheduled according to a first test order; and generating a second test order that schedules the one or more cold bias tests to execute during the one or more time slots.

\* \* \* \* \*